United States Patent [19]

Riseman

[11] 4,419,810
[45] Dec. 13, 1983

[54] SELF-ALIGNED FIELD EFFECT TRANSISTOR PROCESS

[75] Inventor: Jacob Riseman, Poughkeepsie, N.Y.

[73] Assignee: International Business Machines Corporation, Armonk, N.Y.

[21] Appl. No.: 335,892

[22] Filed: Dec. 30, 1981

[51] Int. Cl.³ .......................................... H01L 21/265
[52] U.S. Cl. ................................. 29/571; 29/576 B; 29/591; 148/1.5; 148/187; 148/188
[58] Field of Search .................... 29/571, 576 B, 591; 148/1.5, 187, 188

[56] References Cited

U.S. PATENT DOCUMENTS

| | | | |
|---|---|---|---|
| 3,648,125 | 3/1972 | Peltzer | 148/187 X |
| 3,942,241 | 3/1976 | Harigaya et al. | 148/188 X |
| 4,062,699 | 12/1977 | Armstrong | 148/1.5 |
| 4,089,992 | 5/1978 | Doo et al. | 427/94 |
| 4,104,086 | 8/1978 | Bondur et al. | 148/175 X |
| 4,201,603 | 5/1980 | Scott, Jr. et al. | 148/174 |
| 4,204,894 | 5/1980 | Komeda et al. | 29/571 X |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,256,514 | 3/1981 | Pogge | 148/1.5 |
| 4,322,883 | 4/1982 | Abbas et al. | 148/188 X |
| 4,356,622 | 11/1982 | Widmann | 148/188 X |

OTHER PUBLICATIONS

H. B. Pogge, IBM Technical Disclosure Bulletin, "Narrow Line-Width Masking Method", Nov. 1976, vol. 19, No. 6, pp. 2057-2058.
S. A. Abbas et al., IBM Technical Disclosure Bulletin, "Extending the Minimal Dimensions of Photolithographic . . . ", Sep. 1977, vol. 20, No. 4, pp. 1376-1378.
"A New Edge-Defined Approach for Sub-Micrometer MOSFET Fabrication" by W. R. Hunter et al., IEEE Electron Device Letters, vol. EDL-2, No. 1, Jan. 1981, pp. 4-6.
"Submicrometer Polysilicon Gate CMOS/SOS Technology" by A. C. Ipri et al., IEEE Transactions on Electron Devices, vol. ED-27, No. 7, Jul. 1980, pp. 1275-1279.
"A Novel Submicron Fabrication Technique" by T. N. Jackson et al., IEDM 1979 Conference Volume pp. 58-61.
"A New Short Channel MOS FET with Lightly Doped Drain" by Saito et al. in Denshi Tsushin Rengo Taikai (Japanese), Apr. 1978, pp. 2-20.

Primary Examiner—G. Ozaki
Attorney, Agent, or Firm—George O. Saile

[57] ABSTRACT

A method for fabricating a semiconductor [integrated circuit] structure having a sub-micrometer gate length field effect transistor device is described. An isolation pattern is formed in a semiconductor substrate which isolates regions of the semiconductor within the substrate from one another. Certain of these semiconductor regions are designated to contain field effect transistors [devices]. A heavily doped conductive layer and an insulator layer are formed thereover. The multilayer structure is etched to result in a patterned conductive layer having substantially vertical sidewalls. The pattern of the conductive layer is chosen to be located above the planned source/drain regions with openings in the pattern at the location of the field effect transistor channel. The pattern in the source/drain areas extend over the isolation pattern. A controlled sub-micrometer thickness insulating layer is formed on these vertical sidewalls. The sidewall insulating layer is utilized to controllably reduce the channel length of the field effect transistor. [The sidewall layer is preferably doped with conductive imparting impurities.] The gate dielectric is formed on the channel surface. The source/drain regions [and preferably lightly doped region] are [simultaneously] formed by thermal drive-in from the conductive layer [and sidewall insulating layer respectively]. The desired gate electrode is formed upon the gate dielectric and electrical connections made to the various elements of the field effect transistor devices. [The conductive layer and resulting contacts to said source/drain regions may be composed of polycrystalline silicon, metal silicide, polycide (a combination of layers of polycrystalline silicon and metal silicide) or the like.]

20 Claims, 6 Drawing Figures

SELF-ALIGNED FIELD EFFECT TRANSISTOR PROCESS

DESCRIPTION

Technical Field

This invention relates to semiconductor integrated circuit structure and method for manufacturing such integrated circuits which have field effect transistor devices therein having a sub-micrometer gate length.

CROSS REFERENCES TO RELATED APPLICATIONS (1) Patent application Ser. No. 335,891, filed Dec. 30, 1981, entitled "Sub-micrometer Channel Length Field Effect Transistor Process and Resulting Structure", by R. C. Dockerty.

(2) Patent application Ser. No. 335,893, filed Dec. 30, 1981, entitled "Fabrication Process of Sub-micrometer Channel", By J. Riseman and P. J. Tsang.

(3) Patent application, Ser. No. 335,953, filed Dec. 30, 1981 entitled "MOSFET Structure and Process to Form Micrometer Long Source/Drain Spacing", by F. H. De La Moneda and R. C. Dockerty.

(4) Patent application, Ser. No. 335,894, filed Dec. 30, 1981, entitled "A Method to Fabricate Stud Structure for Self-aligned Metalization", by S. A. Abbas and I. E. Magdo.

BACKGROUND ART

The integrated circuit technology has a need to obtain narrow line widths in the range of 1 micrometer or less by extending standard photolithography techniques and avoiding the need to use the more expensive and complex techniques such as electron beam or X-ray lithography. One such technique is described in H. B. Pogge in IBM Technical Disclosure Bulletin, November 1976, Vol. 19, No. 6, pp.2057-2058, entitled "Narrow Line Widths Masking Method". This method involves the use of a porous silicon followed by the oxidation of the porous silicon. Another technique is described by S. A. Abbas et al. in the IBM Technical Disclosure Bulletin, Vol. 20, No. 4, September 1977, pp. 1376-1378. This method describes the use of polycrystalline silicon masking layers which are made into mask by first using an intermediate mask of oxidation blocking material, such as silicon nitride in the formation of polycrystalline silicon. Line dimensions below about 2 micrometers may be obtained by this technique.

U.S. Pat. Nos. 4,209,349 and 4,209,350 by I. T. Ho et al., U.S. Pat. No. 4,234,362 by J. Riseman and U.S. Pat No. 4,256,514 by H. B. Pogge describe methods for forming narrow dimensioned, for example, sub-micrometer regions on a silicon body. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region as 1 micrometer or less is obtained.

There has been significant effort in the integrated circuit field to develop processes for making sub-micrometer channel length field effect transistor with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4-6, "Sub-micrometer Polysilicon Gate CMOS/SOS Technology" by A. C. Ipri et al. published in IEEE Transactions on Electron Devices, Vol. ED-27, No. 7, July 1980, pp. 1275-1279 and "A Novel Sub-micron Fabrication Technique" by T. N. Jackson et al. published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the W. E. Armstrong U.S. Pat. No. 4,062,699; J. Goel U.S. Pat. No. 4,145,459 and J. H. Scott, Jr. U.S. Pat. No. 4,201,603. The Armstrong patent utilizes an ion implantation and diffusion process to narrow the channel length of his MOSFET. The Goel patent utilizes a process sequence that involves the use of a recess formed in the portion of the semiconductor body and further involves the plating of metal films on each side of the recess until the spacing between the metal films across the recess is equal to desired length of the gate. The Scott, Jr. patent controllably dopes an edge of a polysilicon layer and then is able to remove the undoped polysilicon by etching it with a material which does not etch the doped polysilicon region.

A particularly effective MOS FET configuration allowing densities and performance higher than that heretofore available in such devices is described in "A New Short Channel MOS FET with Lightly Doped Drain" by Saito et al. in Denshi Tsushin Rengo Taikia (Japanese), April 1978, p. 2-20. The LDD N channel MOS FET includes, in addition to the channel separating implanted N+ source and drain regions, the sub-micrometer diffused N— regions, which increases the channel breakdown voltage or snap-back voltage and reduces device drain junction electron impact ionization (and thus, hot electron emission) by spreading the high electric field at the drain pinch-off region into the N— region. This allows either an increase in power supply voltage or reduction in channel length at a given voltage to achieve performance enhancement. An improved process for making such a device is given in patent application Ser. No. 06/217,497 filed Dec. 17, 1980 by S. Ogura and P. J. Tsang and entitled "Method of Fabricating High Speed High Density MOS Dynamic RAM with Lightly Doped Drain" in which the N— LDD region of the device is formed by a controlled N— ion implantation and the forming of sub-micrometer wide $SiO_2$ sidewall spacers abutting to the gate. Other lightly doped drain processes are given in the I. T. Ho and J. Riseman U.S. Pat. Nos. 4,209,349 and 4,209,350. These patents also show self-aligned diffused regions formed by outdiffusion from layers formed on the surface of a semiconductor substrate into the substrate. In the above mentioned Ogura and Tsang's patent application, the polycrystalline silicon gate plate of the LDDFET is formed by conventional lithographic process. Its minimum achievable length is limited by the capability of the lithographic tool used. In the present invention, on the other hand, the self-aligned sidewall formation technique is repeatedly used to form the submicrometer length gate and the LDD sidewall spacers of the device. The minimum achievable device gate length is no longer limited by the lithographic tools but can be set by design requirement. Devices with channel length less than 0.5 micrometers can be readily made with conventional photolithographic tool.

It is therefore desirable to provide a high density, short channel field effect transistor which can be integrated into integrated circuit structures that is useful in memory or logic. It is also useful to have such short channel field effect transistors isolated from one another with dielectric isolation.

SUMMARY OF THE PRESENT INVENTION

In accordance with the present invention a method for fabricating a semiconductor integrated circuit structure having a sub-micrometer gate length field effect transistor devices is described. An isolation pattern is formed in a semiconductor substrate which isolates regions of the semiconductor within the substrate from one another. Certain of these semiconductor regions are designated to contain field effect transistor devices. A heavily doped conductive layer such as first polycrystalline silicon, metal silicide, or the like, layer and an insulator layer are formed thereover. The multilayer structure is etched to result in a patterned conductive first polycrystalline silicon layer or the like having substantially vertical sidewalls. The pattern of the conductive first polycrystalline silicon layer is chosen to be located above the planned source-drain regions with openings in the pattern at the location of the field effect transistor channel. The pattern in the source/drain areas extend over the isolation pattern. A controlled sub-micrometer thickness layer is formed on these vertical sidewalls. The sidewall layer is utilized to controllably reduce the channel length of the field effect transistor. The sidewall layer is preferably doped with conductive imparting impurities. The gate dielectric is formed on the channel surface. The source/drain region and preferably lightly doped region are simultaneously formed by thermal drive-in from the conductive first polycrystalline silicon layer or the like and insulator sidewall layer respectively. The desired gate electrode is formed upon the gate dielectric and electrical connections made to the various elements of the field effect transistor devices.

DISCLOSURE OF THE INVENTION

Referring now more particularly to FIGS. 1 through 6 there is illustrated an embodiment for fabricating a sub-micrometer channel length field effect transistor in a high density integrated circuit structure. The process is illustrated to form N channel MOSFET integrated circuits. However, it would be obvious that P channel field effect transistors can alternatively be formed by the present embodiment by simply reversing the polarity of the various elements of the transistors and associated regions.

Figure 1:
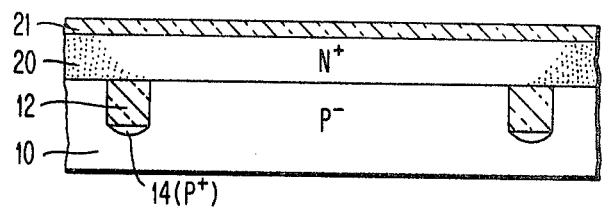
FIGS. 1 through 6 schematically illustrate the process for forming the self-aligned, sub-micrometer channel length lightly doped drain field effect transistors.

The first series of steps involve the formation of the isolation means for isolating regions of monocrystalline silicon from other regions of monocrystalline silicon in a P− <100> crystallographic oriented silicon substrate 10 as thus can be seen with reference to FIG. 1. The isolation may preferably be partial dielectric isolation using materials such as silicon dioxide, glass, polyimide, etc., alone or in combinations. The preferred pattern of partial dielectric isolation 12 define monocrystalline silicon surface regions wherein field effect devices will ultimately be formed. There are many ways in the art to form dielectric isolation regions of this type. One method is described in the Magdo et al. patent application Ser. No. 150,609 filed June 7, 1971 or Peltzer U.S. Pat. No. 3,648,125.

Alternately, the process described in the J. A. Bondur et al. U.S. Pat. No. 4,104,086 can be used. In that patent application and patent's processes for forming partial dielectric isolation retgion 12 are described in detail. A P+ region 14 is typically formed under the dielectric isolation layer region 12 to prevent a formation of an inversion layer and the resulting electrical leakage between isolated monocrystalline regions under the isolation region 12.

Briefly, the recessed dielectric isolation region 12 and 14 may be formed by first thermally oxidizing the surface of the silicon substrate 10 to form silicon dioxide layer (not shown) thereon. A silicon nitride layer (not shown) is then deposited by chemical vapor deposition thereover. The silicon nitride layer has openings formed therein at the desired location of the isolation regions by conventional lithography and etching techniques. Openings are formed in the silicon dioxide layer using the silicon nitride layer as a mask. Then the structure is subjected to a reactive plasma to etch the silicon to a desired depth using the silicon nitride-silicon dioxide layers as a mask. The etched grooves are filled with the desired dielectric such as thermally grown silicon dioxide, chemical vapor deposited silicon dioxide, glass, silicon nitride, organics such as polyimides or the like singularly or in combinations before or after the formations of device structures. The P+ region 14 is formed by the ion implantation of boron before the groove is filled with the insulator. The silicon nitride and silicon dioxide layers are now removed from the surface of the silicon wafer. The surface isolation pattern 12 in the semiconductor silicon substrate which isolates regions of the semiconductor within the substrate from one another is now formed.

There is now deposited a first polycrystalline silicon layer 20 over the entire surface having the surface isolation pattern 12. An N+ polycrystalline silicon layer 20 is deposited by using, for example, silane in a hydrogen amibient in the temperature range of about 500° C. to 1,000° C. and preferably about 600° C. The operative thickness of the polycrystalline silicon is between about 300 to 1000 nanometers with 600 nanometers preferred. The polycrystalline silicon layer in this embodiment is in direct contact with the silicon body 10. The polycrystalline silicon layer may alternatively be doped as deposited or may be deposited substantially undoped and then doped by a subsequent ion implantation and heating process. It is preferred to use the subsequent ion implantation doping of the first polycrystalline silicon layer 20. The ion implantation is done using between about $1 \times 10^{15}$ to $1 \times 10^{16}$ ions/cm$^2$ at 30 to 100 KeV. The preferred conductivity imparting ion used in this process is arsenic. A silicon dioxide layer 21 may now be chemically vapor deposited in for example using SiH$_4$Cl$_2$ and N$_2$O at a temperature of about 800° C. or less under atmospheric or low pressure conditions or thermally grown in an oxygen or oxygen-water vapor ambient at a temperature of about 970° C. technique having a thickness of between about 150 to 400 nanometers.

Figure 2:
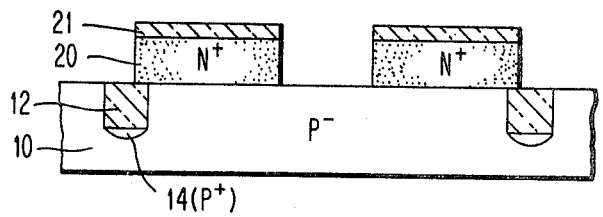

Standard lithography and etching techniques are used to produce remaining portions of the silicon dioxide layer 21 and first polycrystalline silicon layer 20 having substantially vertical sidewalls, as shown in FIG. 2. The desired openings are formed in the layer 21 and this layer 21 is, in turn, used as the etching mask for layer 20. The etching step for the polycrystalline silicon layer 20 is preferably an anisotropic etching process using chlorinated hydrocarbon gases such as described in J. S. Lechaton and J. L. Mauer "A Model for the Etching of Silicon in a $Cl_2$/Ar Plasma", in Plasma Process-Proc. Sym. on Plasma Etching & Deposition, R. G. Frieser & C. J. Magob, Editors, The Electrochem. Society (1981), pp. 75–85 or Harvilchuck et al. patent application Ser. No. 594,413 filed July 9, 1975, now abandoned and continuation patent application Ser. No. 960,322 filed Nov. 13, 1978.

The pattern of layers 20, 21 are chosen to be located above the planned source/drain regions with openings in the pattern at the location of the field effect transistor's channel. The pattern in the source/drain areas extend over the isolation pattern 12 as shown in FIG. 2.

Figure 3:
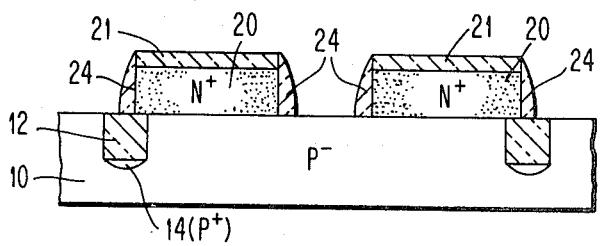

A sidewall insulator layer 24 is formed upon the vertical sidewalls of the polycrystalline silicon layer 20. This layer 24 is preferably silicon dioxide. However, the layer may alternatively be composed of silicon nitride, aluminum oxide, or the like, or combinations of these insulators with silicon dioxide. A silicon dioxide layer may be thermally grown in oxygen or oxygen-water vapor ambient at a temperature of about 970° C. to form a thermal silicon dioxide layer. The preferred thickness of this layer is between about 150 to 1000 nanometers. This thickness depends upon the length of the gate electrode desired. A second method for growing silicon dioxide involves the use of chemical vapor deposition process wherein $SiH_4$, $O_2$ at 450° C., or $SiH_2Cl_2$ and $N_2O$ at a temperature of about 800° C. under atmospheric or low pressure conditions. The deposition of silicon nitride is usually formed by chemical vapor deposition using the process conditions of silane, ammonia and nitrogen carrier gas at a temperature of about 800° C. under atmospheric or low pressure conditions as described, for example, in the V. Y. Doo U.S. Pat. No. 4,089,992. Alternatively, the sidewall can be partly thermally grown silicon dioxide and partly chemical vapor deposited silicon dioxide or any of the other insulator materials. In the case where the chemical vapor deposition process is utilized a controlled uniform conformal layer of the insulator 24 is deposited over the polycrystalline silicon layer 20 and openings therein on both the horizontal and vertical surfaces. This layer 24 is subjected to the preferential removal from the horizontal surfaces while substantially leaving the layer upon the substantially vertical sidewalls in an anisotropic etching ambient. The etching may be done, for example, in a reactive ion etching system using $CF_4$ and $H_2$ gases as described in L. M. Ephrath, J. Electrochem. Soc. Vol. 124, p. 284C (1977). The result of the sidewall formation process is shown in FIG. 3.

The sidewall insulator layer 24 can be doped in situ such as an arsenic doped silicon dioxide glass or after its deposition by an ion implantation process. This alternative is utilized where it is desired to form a lightly doped drain field effect transistor structure. The sidewall layer 24 is then a source of dopant impurities which will subsequently be made to outdiffuse into the substrate 10 to form the lightly doped regions 32. The regions 32 are part of the source/drain structure of the field effect transistor. Where the field effect transistor device is a N channel device the dopant for layer 24 is usually phosphorus or arsenic.

The surface conductivity of the P− substrate 10 is adjusted in the channel area where field effect transistors are to be formed. The threshold, $V+$, is adjusted by using for example a boron ion implantation into the channel region either at this time in the process or after the formation of the gate dielectric layer 34.

Figure 4:
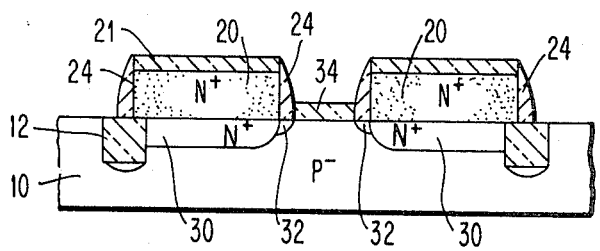

The structure is heated to form the heavily doped portions of the source/drains 30 of the field effect transistor by outdiffusion from the polycrystalline silicon layer 20. Simultaneously therewith where the sidewall insulator is doped, the lightly doped portions 32 of the source/drains of the field effect transistors are formed by outdiffusion from that insulating layer. The result of this process is illustrated in FIG. 4 for the lightly doped drain structure. It should be understood however, that is not necessary to form such a lightly doped drain structure to have a useful field effect transistor device.

The structure is now subjected to an oxidizing atmosphere such as oxygen or oxygen water vapor ambient at about 950° C. to form on the exposed substrate 10 the gate dielectric insulator 34 of the field effect transistor structure. The preferred thickness of this gate dielectric is between about 15 to 50 nanometers.

Figure 5:
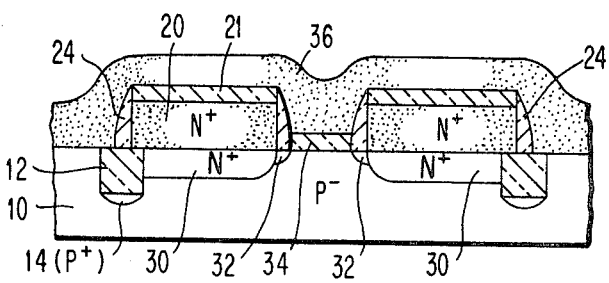
Figure 6:
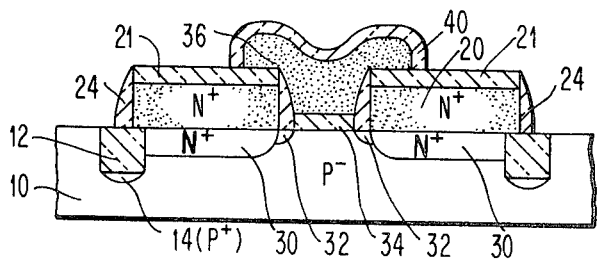

The gate electrode for each of the field effect transistors is now formed over the gate dielectric and the insulating layer 21 and delineation is made by conventional lithography and etching or lift-off techniques to form the gate layer 36. FIG. 5 shows the undelineated gate contact 36 and FIG. 6 shows the delineated contact 36 with an insulator coating 40 thereover. The composition of the gate electrode 36 can be a highly doped polycrystalline silicon, aluminum, tantalum or similar metal. Where the contact 36 is polycrystalline silicon, the insulating layer 40 may be simply formed by oxidation in a convenient oxidizing ambient to about 200 nanometers. However, there are advantages in using metal such as aluminum, tungsten, molybdenum, or the like, which can be deposited by low temperature processes such as sputtering or evaporation. These metals do not need to be doped as does polycrystalline silicon and therefore, would improve breakdown over polycrystalline silicon.

A higher level of metallurgy (not shown) is used to contact the source/drain contacts 20 and the gate electrode 36. Preferably this level of metallurgy is aluminum or the like. Passivation and insulation between the metallurgy levels may be by sputtered or plasma deposited silicon dioxide, plasma deposited silicon nitride, polyimide or a combination of those materials or the like.

The process produces a self-aligned field effect transistor gate structure. The overlap capacitance is minimal since the gate electrode 36 lies over the sidewall insulator 24 and N source/drain regions 30. The channel length may readily be made to a sub-micrometer dimension while using a mask opening of for example 1.5 micrometers where sidewall layer 24 is, for example, 0.4 microns, the channel length and gate electrode width will be 0.7 microns. Therefore, sub-micrometer dimensions are obtained without using sub-micrometer lithography. It is also noteworthy that the electrical contacts 20 to the source/drain regions 30 are self-aligned since they are both the source of the dopant that formed the source/drain regions 30 and the first level ohmic contact thereto.

To further improve the electrical conductivity of the device gate electrode, refractory metal silicide, e.g., $WSi_2$, $TaSi_2$, $PdSi_2$, or the so-called polycide film that consists of a layer of metal silicide in combination with a layer or layers of polycrystalline silicon can be used to replace the polycrystalline silicon layer in the embodiments, to form the source/drain contacts. Metal silicide layer thickness, for example, would range from about 150 to 500 nanometers. The polycide thickness would range from about 200 to 400 nanometers polycrystalline silicon and 150 to 500 nanometers metal silicide.

While the invention has been particularly shown and described with reference to the preferred embodiments thereof, it will be understood by those skilled in the art that various changes in form and detail may be made therein without departing from the spirit and scope of the invention. For example, since this technology can be applied to N channel devices and P channel devices separately, it was obvious for people skilled in the art to combine the two and develop through some additional steps a complementary FET MOS field effect transistor self-aligned metal technology.

What is claimed is:

1. A method of forming self-aligned field effect transistors comprising:
    forming a heavily doped conductive layer of one conductivity type upon a monocrystalline silicon substrate of the opposite conductivity type to said one type;
    forming an insulator layer upon the surface of said conductive layer;
    forming openings with substantially vertical sidewalls through the said conductive layer to said silicon substrate in at least the locations of the planned gates of said field effect transistors;
    depositing a uniform thickness conformal insulating layer on said insulator layer over said conductive layer and the exposed said substrate and preferentially removing said insulating layer from the horizontal surfaces and leaving a sidewall insulating layer upon said substantially vertical sidewalls;
    wherein the said uniform thickness conformal layer is so chosen to form the desired channel length of said field effect transistors;
    heating the structure to form the heavily doped portions of the sources/drains of said field effect transistors of said one conductivity type by outdiffusion from said conductive layer;
    oxidizing the exposed said substrate to form the gate insulator of said field effect transistors;
    forming the gate electrode for each of said field effect transistors over said gate insulator; and
    forming electrical contacts to said conductive layer which are in electrical ohmic contact with said sources/drains through said insulator layer and electrical contacts to said gate electrodes.

2. The method of claim 1 wherein said conductive layer is polycrystalline silicon.

3. The method of claim 2 wherein the said polycrystalline silicon layer is N+ type conductivity imparting impurity and is doped by an ion implantation process after its deposition using between about $1 \times 10^{15}$ to $1 \times 10^{16}$ ions/cm$^2$ at between about 30 to 100 KeV.

4. The method of claim 3 wherein the said conductivity imparting impurity is arsenic.

5. The method of claim 1 wherein said conductive layer is a combination layer of polycrystalline silicon and metal silicide.

6. The method of claim 1 wherein said conductive layer is a metal silicide.

7. The method of claim 1 wherein the said sidewall insulating layer is between 150 to 1000 nanometers and effectively reduces the gate electrode and channel length to less than about 1000 nanometers.

8. The method of claim 1 wherein said sidewall insulating layer is composed of chemical vapor deposited silicon dioxide which had been doped with N— conductivity imparting impurities and said N— impurities outdiffuse from said sidewall insulating layer into said monocrystalline substrate during said heating to form lightly doped portions of the sources/drains of said field effect transistors.

9. The method of claim 1 wherein the sidewall insulating layer is between about 150 to 1000 nanometers in thickness.

10. The method of claim 1 wherein the surface of said monocrystalline silicon substrate has regions of monocrystalline silicon isolated from one another by an at least substantially silicon dioxide isolation pattern in said substrate.

11. The method of claim 1 wherein said gate electrode is composed of doped polycrystalline silicon.

12. The method of claim 1 wherein said gate electrode is composed substantially of aluminum.

13. A method of forming self-aligned field effect transistors comprising:
    forming a heavily doped conductive layer of one conductivity type upon a monocrystalline silicon substrate of the opposite conductivity type to said one type;
    forming an insulator layer upon the surface of said conductive layer;
    forming openings with substantially vertical sidewalls through the said conductive layer to said silicon substrate in at least the locations of the planned gates of said field effect transistors;
    depositing a uniform thickness conformal doped insulating layer on said insulator layer over said conductive layer and the exposed said substrate and preferentially removing said insulating layer from the horizontal surfaces and leaving a sidewall insulating layer upon said substantially vertical sidewalls;
    wherein the said uniform thickness conformal layer is so chosen to form the desired channel length of said field effect transistors;
    heating the structure to form the heavily doped of said one conductivity type portions of the sources/drains of said field effect transistors by outdiffusion from said conductive layer, and the lightly doped portions of the sources/drains of said field effect transistors by outdiffusion from said sidewall insulating layer;
    oxidizing the exposed said substrate to form the gate insulator of said field effect transistors;
    forming the gate electrode for each of said field effect transistors over said gate insulator; and
    forming electrical ohmic contacts to said conductive layer which are in electrical contact with said sources/drains to said gate electrodes.

14. The method of claim 13 wherein said conductive layer is a polycrystalline layer.

15. The method of claim 14 wherein the said polycrystalline silicon layer is N+ type conductivity imparting impurity and is doped by an ion implantation process after its deposition using between about $1 \times 10^{15}$ to $1 \times 10^{16}$ ions/cm$^2$ at between about 30 to 100 KeV.

16. The method of claim 14 wherein said field effect transistors are N channel, the doping of said polycrystalline silicon is N+ type and the doping of said sidewall insulating layer is N− type.

17. The method of claim 13 wherein said conductive layer is a combination layer of polycrystalline silicon and metal silicide.

18. The method of claim 13 wherein said conductive layer is a metal silicide.

19. The method of claim 13 wherein the sidewall insulating layer is between about 150 to 1000 nanometers in thickness.

20. The method of claim 13 wherein the said sidewall insulating layer is between about 150 to 1000 nanometers and effectively reduces the gate electrode and channel length to less than about 1000 nanometers.

* * * * *